United States Patent
Suga et al.

(10) Patent No.: US 9,496,742 B2
(45) Date of Patent: Nov. 15, 2016

(54) SECONDARY BATTERY CONTROL DEVICE

(75) Inventors: Sohei Suga, Yokohama (JP); Tamaki Miura, Yamato (JP);
(Continued)

(73) Assignee: NISSAN MOTOR CO., LTD., Yokohama-Shi (JP)

(*) Notice: Subject to any disclaimer, the term of this patent is extended or adjusted under 35 U.S.C. 154(b) by 210 days.

(21) Appl. No.: 14/345,773

(22) PCT Filed: Sep. 11, 2012

(86) PCT No.: PCT/JP2012/073176
§ 371 (c)(1),
(2), (4) Date: Mar. 19, 2014

(87) PCT Pub. No.: WO2013/042580
PCT Pub. Date: Mar. 28, 2013

(65) Prior Publication Data
US 2014/0225570 A1 Aug. 14, 2014

(30) Foreign Application Priority Data
Sep. 20, 2011 (JP) ................. 2011-204222
Jul. 9, 2012 (JP) ................. 2012-153883

(51) Int. Cl.
*H02J 7/00* (2006.01)
*G01R 31/36* (2006.01)
(Continued)

(52) U.S. Cl.
CPC .......... *H02J 7/007* (2013.01); *G01R 31/3679* (2013.01); *H01M 10/42* (2013.01);
(Continued)

(58) Field of Classification Search
USPC ................ 320/132, 133, 134, 136
See application file for complete search history.

(56) References Cited

U.S. PATENT DOCUMENTS

| 5,744,936 A | * | 4/1998 | Kawakami | ........ H01M 10/4207 320/120 |
| 6,664,000 B1 | * | 12/2003 | Sonobe | ........ H01M 2/34 429/100 |

(Continued)

FOREIGN PATENT DOCUMENTS

| JP | 11-183574 A | 7/1999 |
| JP | 2004-85574 A | 3/2004 |

(Continued)

OTHER PUBLICATIONS

Korean Office Action, Jan. 14, 2015, 4 pages.

*Primary Examiner* — Brian Ngo
(74) *Attorney, Agent, or Firm* — Foley & Lardner LLP

(57) ABSTRACT

A control device of a secondary battery has a current detection unit (103) that detects a charge current to the secondary battery (101) and a discharge current from the secondary battery (101); a calculation unit (107) that calculates, from the charge current and the discharge current, a charge-discharge efficiency and a discharge-charge efficiency when performing a charge operation and a discharge operation; a deterioration judgment unit (107) that judges a deterioration state of the secondary battery (101) from a temporal change rate of the charge-discharge efficiency and a temporal change rate of the discharge-charge efficiency; and a control unit (107) that sets a charge termination voltage of the secondary battery (101) in accordance with the deterioration state.

8 Claims, 16 Drawing Sheets

(75) Inventors: Yosuke Suzuki, Yokosuka (JP);
Shinsaku Ehara, Fujisawa (JP);
Yoshiaki Nitta, Yokohama (JP);
Masanori Aoyagi, Ebina (JP);
Takayuki Matsuoka, Tokyo (JP)

(51) Int. Cl.
*H01M 10/42* (2006.01)
*H01M 10/48* (2006.01)
*H01M 10/052* (2010.01)

(52) U.S. Cl.
CPC .......... *H01M 10/486* (2013.01); *H02J 7/0029* (2013.01); *H02J 7/0068* (2013.01); *H02J 7/0081* (2013.01); *H02J 7/0083* (2013.01); *H02J 7/0091* (2013.01); *H01M 10/052* (2013.01); *H02J 2007/0037* (2013.01); *Y02B 40/90* (2013.01); *Y02E 70/40* (2013.01); *Y02T 10/7011* (2013.01)

(56) References Cited

U.S. PATENT DOCUMENTS

| | | | | |
|---|---|---|---|---|
| 6,850,038 | B2* | 2/2005 | Arai | H01M 10/48 320/132 |
| 2002/0109506 | A1* | 8/2002 | Kawakami | G01R 31/3679 324/522 |
| 2003/0006735 | A1* | 1/2003 | Kawakami | G01R 31/361 320/133 |
| 2003/0076074 | A1* | 4/2003 | Kawai | H02J 7/0075 320/136 |
| 2008/0224667 | A1 | 9/2008 | Tanaka et al. | |

FOREIGN PATENT DOCUMENTS

| | | |
|---|---|---|
| JP | 2008-228492 A | 9/2008 |
| JP | 2010-271287 A | 12/2010 |
| JP | 2011-069693 A | 4/2011 |

* cited by examiner

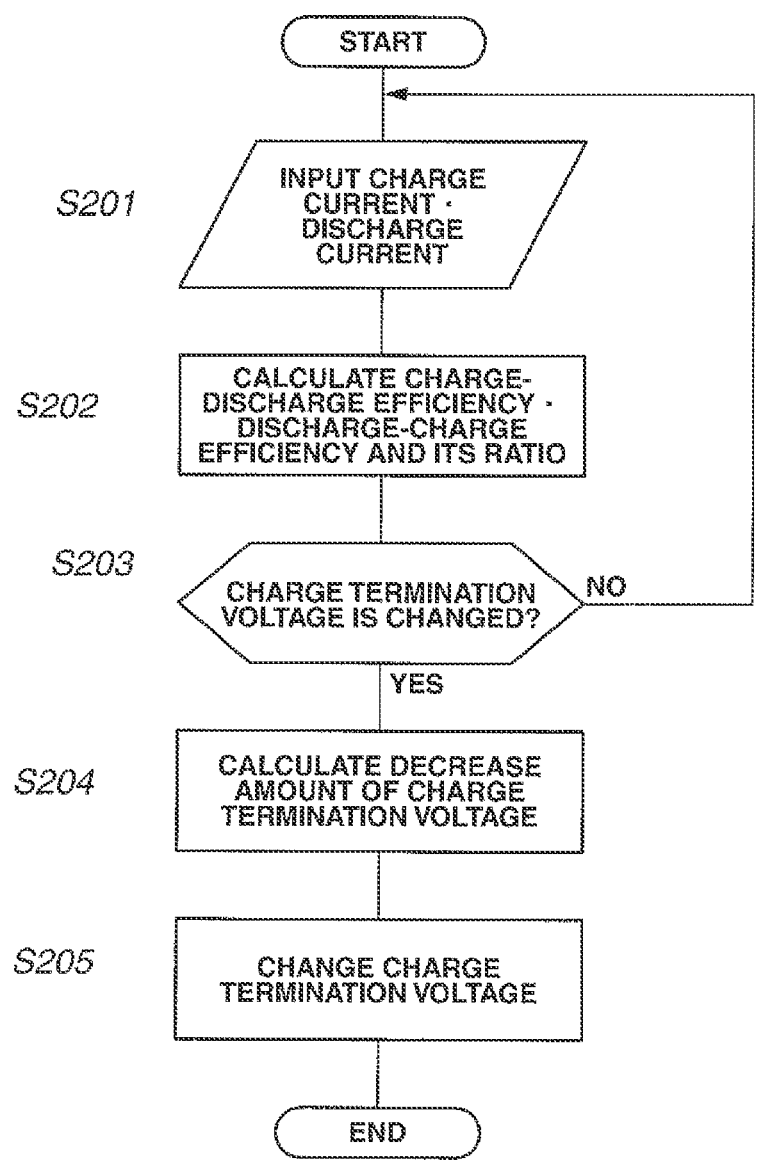

SECONDARY BATTERY CONTROL DEVICE

TECHNICAL FIELD

The present invention relates to a control device that performs capacity control of charge and discharge of a secondary battery.

BACKGROUND ART

A charging method of a lithium-ion secondary battery, by which a degree of deterioration of the lithium-ion secondary battery is detected from at least anyone of an internal resistance of the battery, a capacity to which the battery can be charged and the number of cycles of the charge then when the deterioration progresses, the battery is fully charged with a setting voltage set to be low, has been known (Patent Document 1).

However, a related art technique above has no awareness of problem about deterioration of a capacity balance between a positive electrode and a negative electrode, and does not perform a control according to each deterioration state of the positive electrode and the negative electrode. Because of this, in the related art technique, even in a case of capacity reduction of the positive electrode which does not intrinsically require decreasing a charge termination voltage, the charge termination voltage is set to be low. Thus, there is a problem of excessively limiting the charge of the battery.

CITATION LIST

Patent Document

Patent Document 1: Japanese Patent Provisional Publication Tokkai No. 2008-228492

SUMMARY OF THE INVENTION

An object of the present invention is to provide a control device of the secondary battery, which is capable of setting an optimal charge termination voltage on the basis of a deterioration state of the secondary battery.

In the present invention, the deterioration state of the secondary battery is detected from a temporal change rate of a charge-discharge efficiency, and a temporal change rate of a discharge-charge efficiency, and the charge termination voltage is set in accordance with this detection result.

According to the present invention, since presence or absence of the deterioration of capacity of the negative electrode of the secondary battery can be detected from the temporal change rate of the charge-discharge efficiency and the temporal change rate of the discharge-charge efficiency, in a case where the deterioration of capacity of the negative electrode is detected, the charge termination voltage can be set to be low. On the other hand, in a case where only the deterioration of capacity of the positive electrode is detected, it is possible to forbid the charge termination voltage from being set to be low. As a consequence, an optimal charge termination voltage setting without excessively limiting the charge of the battery can be realized.

BRIEF DESCRIPTION OF DRAWINGS

FIG. 2 is a flow chart showing a control procedure of a control unit of FIG. 1.

DESCRIPTION OF EMBODIMENTS

In the following description, embodiments of the present invention will be explained with reference to the drawings.

Figure 1:
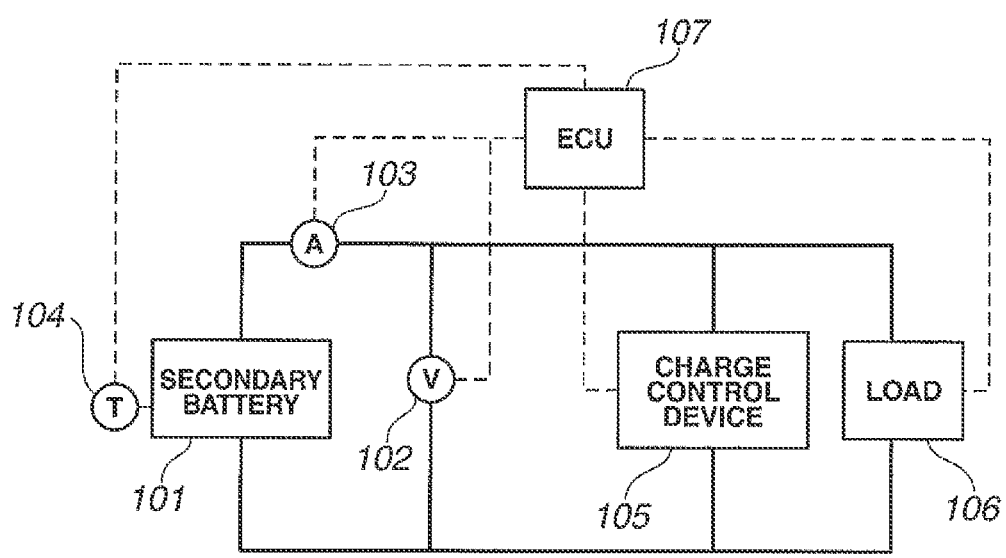
FIG. 1 is a block diagram of a secondary battery system that employs an embodiment of the present invention.

FIG. 1 is a block diagram showing a secondary battery system that employs a control device of a secondary battery of the present invention. The embodiments of the present invention will be explained with the system, which supplies DC power of a secondary battery 101 to a load 106 then drives the load 106 and also charges the secondary battery 101 with power that is supplied to the secondary battery 101 through a charge control device 105, being an example. Here, the secondary battery 101 shown in FIG. 1 can be formed by combining one or more battery cells 1 shown in FIGS. 8 and 9. The battery cell 1 shown in FIGS. 8 and 9 is a lithium-based flat laminated-type thin secondary battery, and is called also a thin battery 1.

Figure 8:
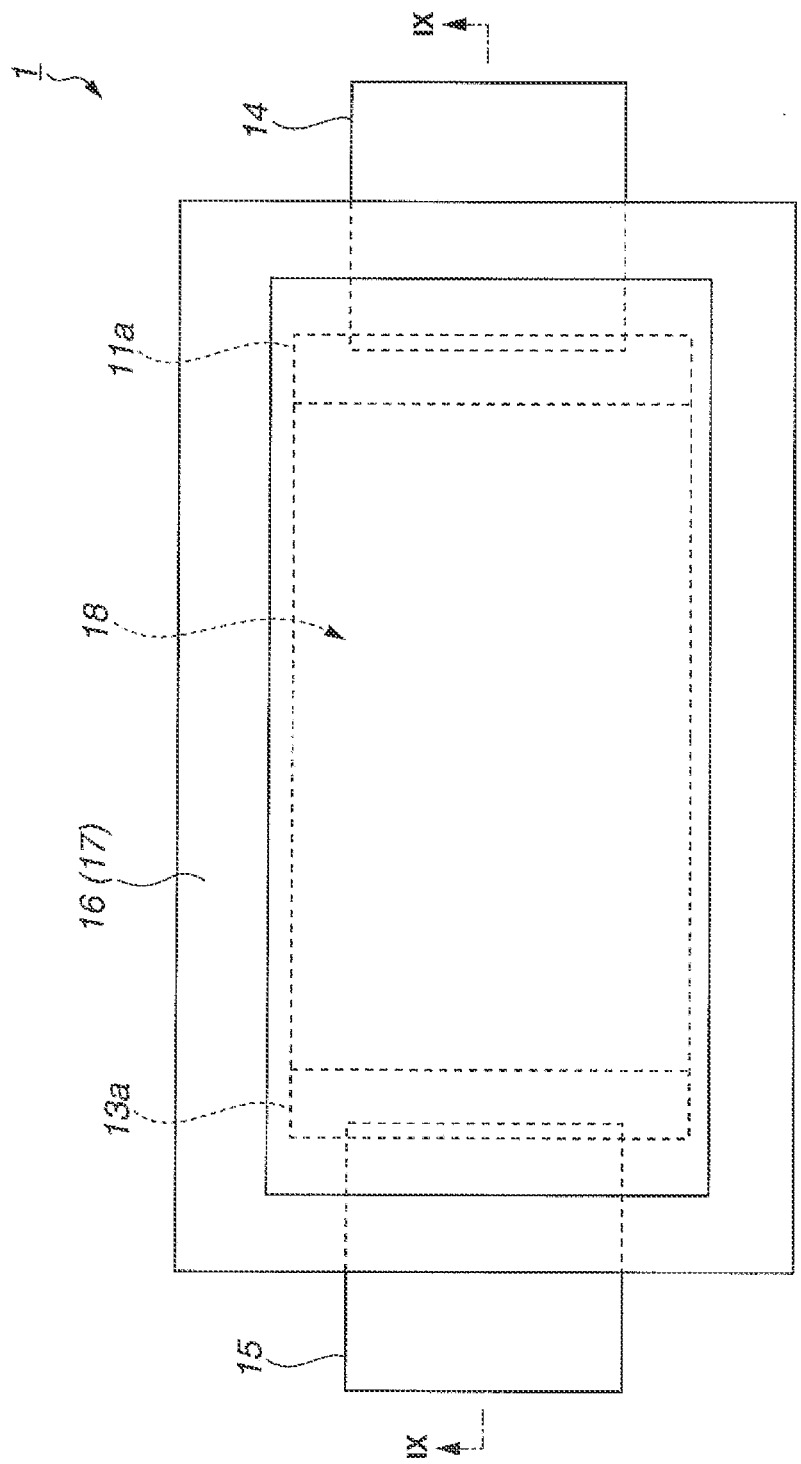
FIG. 8 is a plan view of an example of the secondary battery of FIG. 1.
Figure 9:
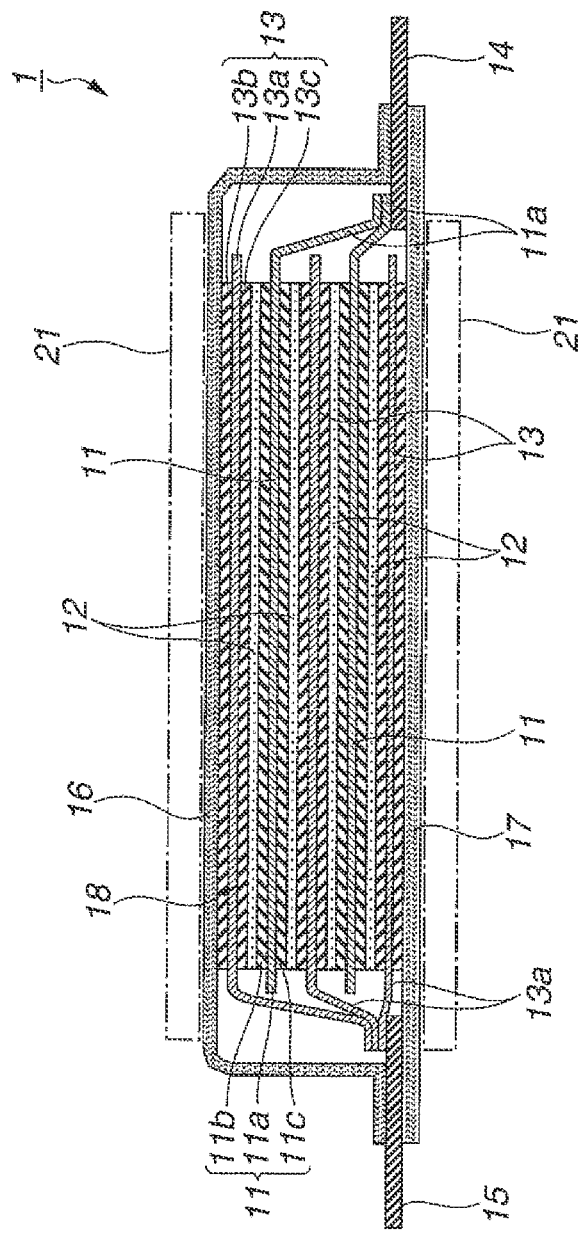
FIG. 9 is a sectional view taken along a line IX-IX of FIG. 8.

As shown in FIGS. 8 and 9, the thin battery 1 is formed from two positive electrode plates 11, four separators 12, three negative electrode plates 13, a positive electrode terminal 14, a negative electrode terminal 15, an upper jacket member 16, a lower jacket member 17 and electrolyte (not shown). A structure of the thin battery 1 explained below is a typical structure, and the control device of the present invention is not intended for only the use of this typical battery. The control device of the present invention can also be applied to the secondary battery except this typical battery.

The positive electrode plate 11, the separator 12, the negative electrode plate 13 and the electrolyte form a power generating element 18. The positive electrode plate 11 and the negative electrode plate 13 form an electrode plate. The upper jacket member 16 and the lower jacket member 17 form a pair of jacket members.

The positive electrode plate 11 forming the power generating element 18 has a positive electrode side current collector 11a that extends up to the positive electrode terminal 14 and positive electrode layers 11b and 11c that are formed on both main surfaces of a part of the positive electrode side current collector 11a. Here, the positive electrode layers 11b and 11c of the positive electrode plate 11 are not formed on both main surfaces of the whole of the positive electrode side current collector 11a, but as shown in FIG. 9, each of the positive electrode layers 11b and 11c is formed only on a part of the main surface of the positive electrode side current collector 11a where the positive electrode plate 11 and the separator 12 substantially overlap when forming the power generating element 18 by layering the positive electrode plate 11, the separator 12 and the negative electrode plate 13.

In the present embodiment, although the positive electrode plate 11 and the positive electrode side current collector 11a are formed by a piece of conductor, the positive electrode plate 11 and the positive electrode side current collector 11a could be formed as a separate member then be bonded together.

The positive electrode side current collector 11a of the positive electrode plate 11 is formed from electrochemically stable metal leaf (or electrochemically stable metal foil) such as aluminium leaf (or foil), aluminium alloy leaf (or foil), copper leaf (or foil) and nickel leaf (or foil).

The positive electrode layers 11b and 11c of the positive electrode plate 11 are formed by coating the both main surfaces of a part of the positive electrode side current collector 11a with mixture of, for instance, lithium compound oxide such as lithium nickelate ($LiNiO_2$), lithium manganate ($LiMnO_2$) and lithium cobalt oxide (lithium cobaltate) ($LiCoO_2$), positive electrode active material such as chalcogenide (S, Se, Te), conductive agent such as carbon black, adhesive such as aqueous dispersion of polytetrafluoroethylene, and solvent and by drying and rolling them.

The negative electrode plate 13 forming the power generating element 18 has a negative electrode side current collector 13a that extends up to the negative electrode terminal 15 and negative electrode layers 13b and 13c that are formed on both main surfaces of a part of the negative electrode side current collector 13a. Here, also the negative electrode layers 13b and 13c of the negative electrode plate 13 are not formed on both main surfaces of the whole of the negative electrode side current collector 13a, but as shown in FIG. 9, each of the negative electrode layers 13b and 13c is formed only on a part of the main surface of the negative electrode side current collector 13a where the negative electrode plate 13 and the separator 12 substantially overlap when forming the power generating element 18 by layering the positive electrode plate 11, the separator 12 and the negative electrode plate 13.

In the present embodiment, although the negative electrode plate 13 and the negative electrode side current collector 13a are formed by a piece of conductor, the negative electrode plate 13 and the negative electrode side current collector 13a could be formed as a separate member then be bonded together.

The negative electrode side current collector 13a of the negative electrode plate 13 is formed from electrochemically stable metal leaf (or electrochemically stable metal foil) such as nickel leaf (or foil), copper leaf (or foil), stainless leaf (or foil) and iron leaf (or foil).

The negative electrode layers 13b and 13c of the negative electrode plate 13 are formed, for example, as follows. By mixing aqueous dispersion, which is precursor material of organic substance sintered member, such as styrene-butadiene-rubber resin powder with negative electrode active material, which occludes and releases lithium ions of the positive electrode active material, such as amorphous carbon, non-graphitizable carbon, graphitizable carbon and graphite and by grinding them after drying them, main material that carries or supports carbonized styrene-butadiene-rubber on a carbon particle surface is prepared. Binding agent such as acrylic resin emulsion is further mixed with this main material, then by coating the both main surfaces of a part of the negative electrode side current collector 13a with this mixture and drying and rolling them, the negative electrode layers 13b and 13c of the negative electrode plate 13 are formed.

Especially when the amorphous carbon or the non-graphitizable carbon is used as the negative electrode active material, since characteristics of flatness of electric potential at charging and discharging are poor and an output voltage also decreases with a discharge amount, in a case where it is used as a power source of an electric vehicle, no abrupt output reduction occurs. Thus, this is advantageous.

The separator 12 of the power generating element 18 is an element that prevents a short circuit between the positive electrode plate 11 and the negative electrode plate 13. The separator 12 might have a function of holding the electrolyte. This separator 12 is a microporous film formed from, for instance, polyolefine such as polyethylene (PE) and polypropylene (PP), which also has a function of interrupting current by the fact that when overcurrent (excess current) flows, pores on the layer are closed by heat of the overcurrent.

The separator 12 according to the present embodiment is not limited to a single-layered film such as the polyolefine. Three-layered film structure formed by sandwiching a polypropylene film between polyethylene films or a layered structure formed by the polyolefine microporous film and an organic nonwoven fabric could be used as the separator 12. By employing multi-layered separator 12 in this manner, the separator 12 can be given functions of preventing the overcurrent, holding the electrolyte and retaining a shape of the separator (improving stiffness or rigidity of the separator).

The power generating element 18 described above is formed by alternately arranging the positive electrode plate 11 and the negative electrode plate 13 in layers through the separator 12. The two positive electrode plates 11 are each connected to the metal foil positive electrode terminal 14 through the respective positive electrode side current collectors 11a, while the three negative electrode plates 13 are each connected to the metal foil negative electrode terminal 15 through the respective negative electrode side current collectors 13a.

Here, each of the numbers of the positive electrode plates 11, the separators 12 and the negative electrode plates 13 of the power generating element 18 is not limited to the numbers of those described above. For instance, the power generating element 18 can be formed even by one positive electrode plate 11, two separators 12 and two negative electrode plates 13. The power generating element 18 could be formed by selecting each of the numbers of the positive electrode plates 11, the separators 12 and the negative electrode plates 13 as required.

The positive electrode terminal 14 and the negative electrode terminal 15 are not especially limited as long as the positive electrode terminal 14 and the negative electrode terminal 15 are formed from electrochemically stable metal material. As the positive electrode terminal 14, as same as the above positive electrode side current collector 11*a*, for instance, it could be the aluminium leaf (or foil), the aluminium alloy leaf (or foil), the copper leaf (or foil) and the nickel leaf (or foil), each thickness of which is approx. 0.02 mm. As the negative electrode terminal 15, as same as the above negative electrode side current collector 13*a*, for instance, it could be the nickel leaf (or foil), the copper leaf (or foil), the stainless leaf (or foil) and the iron leaf (or foil), each thickness of which is approx. 0.02 mm.

As described above, in the present embodiment, the metal foil itself forming the current collectors 11*a* and 13*a* of the electrode plates 11 and 13 is extended up to the electrode terminals 14 and 15, in other words, the electrode layer (the positive electrode layers 11*b* and 11*c* and the negative electrode layers 13*b* and 13*c*) is formed at a part of a piece of the metal foil 11*a* and 13*a*, then the electrode plates 11 and 13 are connected to the electrode terminals 14 and 15 with the remaining edge portion of the metal foil 11*a* and 13*a* being a connecting member connected to the electrode terminal. However, the metal foil forming the current collectors 11*a* and 13*a* that are respectively arranged between the positive electrode layers 11*b* and 11*c* and the negative electrode layers 13*b* and 13*c* and the metal foil forming the connecting member might be connected to each other by different material or different element. In the present embodiment explained below, the explanation will be made with the assumption that the current collectors 11*a* and 13*a* respectively arranged between the positive electrode layers 11*b* and 11*c* and the negative electrode layers 13*b* and 13*c* and the connecting member are formed by a piece of the metal foil.

The power generating element 18 described above is accommodated and sealed by the upper jacket member 16 and the lower jacket member 17. Although structures of the upper jacket member 16 and the lower jacket member 17 are not especially illustrated, each of them has three-layered structure, from an inside toward an outside of the thin battery 1, of an inner side layer that is formed from a resin film having excellent resistance of electrolyte and good thermal adhesion performance such as polyethylene, modified polyethylene, polypropylene, modified polypropylene and ionomer, a middle layer that is formed from metal foil such as aluminum and an outer side layer that is formed from a resin film having good electrical insulation performance such as polyamide-based resin and polyester-based resin.

Therefore, each of the upper jacket member 16 and the lower jacket member 17 is formed by material having flexibility such as resin-metal thin film laminate material obtained by bonding (or laminating) the resin such as the polyethylene, the modified polyethylene, the polypropylene, the modified polypropylene and the ionomer onto one side surface of the metal foil such as the aluminum (onto an inside surface of the thin battery 1) and bonding (or laminating) the polyamide-based resin or the polyester-based resin onto the other side surface of the metal foil (onto an outside surface of the thin battery 1).

The jacket members 16 and 17 have the metal layer in addition to the resin layer in this manner, thereby increasing strength of the jacket member itself. Further, the inner side layer of the jacket members 16 and 17 is formed from the resin such as the polyethylene, the modified polyethylene, the polypropylene, the modified polypropylene and the ionomer, thereby securing good adhesion performance with the metal electrode terminals 14 and 15.

Here, as shown in FIGS. 8 and 9, the positive electrode terminal 14 comes out from one side end of the sealed jacket members 16 and 17, and the negative electrode terminal 15 comes out from the other side end of the sealed jacket members 16 and 17, thus there appears a gap in an adhesion part between the upper jacket member 16 and the lower jacket member 17 by a thickness of each electrode terminal 14 and 15. In order to keep the sealing performance of an inside of the thin battery 1, a seal film formed from, for instance, the polyethylene or the polypropylene could be interpose in portions where the electrode terminals 14 and 15 and the jacket members 16 and 17 contact each other. From the viewpoint of the thermal adhesion performance, it is preferable that this seal film, at both sides of the positive electrode terminal. 14 and the negative electrode terminal 15, be formed from the same kind of or the same series of resin as the resin forming the jacket members 16 and 17.

The power generating element 18, a part of the positive electrode terminal 14 and a part of the negative electrode terminal 15 are enclosed by these jacket members 16 and 17, and an inside space formed by the jacket members 16 and 17 is brought into a vacuum state by vacuum suction while infusing liquid electrolyte that contains solute of lithium salt such as lithium perchlorate, lithium tetrafluoroborate and lithium hexafluorophosphate in organic liquid solvent. Subsequently, an outer peripheral edges of the jacket members 16 and 17 are thermal-bonded (or thermal-adhered) by thermal pressing, then both peripheral edges are sealed.

As the organic liquid solvent forming the electrolyte, it is ester-based solvent such as propylene carbonate (PC), ethylene carbonate (EC) dimethyl carbonate (DMC) and Ethyl methyl carbonate. However, the organic liquid solvent of the present embodiment is not limited to these, but organic liquid solvent obtained by mixing and compounding ether-based solvent such as γ-butyrolactone (γ-BL) and diethoxyethane (DEE) and the like with the ester-based solvent could be used.

Returning to FIG. 1, the secondary battery 101 is formed by the above thin battery 1 alone or by connecting a plurality of the thin batteries 1 by series connection and/or parallel connection. Then, both terminals of the secondary battery 101 are connected to each of the charge control device 105 and the load 106 by parallel connection.

Regarding the charge control device 105, for instance, in a case where the load 106 is configured by a device having a regenerative function such as a motor/generator, the charge control device 105 is a device that controls supply of a regenerative power generated by this load 106 to the secondary battery 101. Further, the charge control device 105 could be a device that controls supply of power, which is provided from an external charging system (such as a charging stand installed outside the vehicle that mounts therein the control device of the secondary battery of the present embodiment), to the secondary battery 101.

A voltage sensor 102 detects a voltage between both terminals of the secondary battery 101, and outputs a detection signal to a control unit 107. A current sensor 103 detects a discharge current flowing from the secondary battery 101 and a charge current flowing to the secondary battery 101, and outputs a detection signal to the control unit 107. A temperature sensor 104 detects temperature of the secondary battery 101, and outputs a detection signal to the control unit 107.

The control unit 107 reads the detection signals from the voltage sensor 102, the current sensor 103 and the temperature sensor 104, and controls the charge control device 105 and the load 106. In particular, the control unit 107 of the present embodiment calculates a charge-discharge efficiency and a discharge-charge efficiency from the charge current and the discharge current of the secondary battery 101, and judges a deterioration state of the secondary battery 101 from temporal change characteristics of these charge-discharge efficiency and discharge-charge efficiency, and further sets a charge termination voltage of the secondary battery 101 according to this deterioration state by the control of the charge control device 105.

Here, regarding the charge-discharge efficiency in the present embodiment, in a case where the discharge (a discharge 1 (a first discharge), a first output electricity quantity)→the charge (a charge 1 (first charge), a first input electricity quantity)→the discharge (a discharge 2 (a second discharge), a second output electricity quantity) are carried out, the charge-discharge efficiency is defined as a ratio between the first output electricity quantity and the first input electricity quantity. Normally, the charge-discharge efficiency is a numerical value of 1 or less.

The charge-discharge efficiency=the first output electricity quantity (a discharge capacity)/the first input electricity quantity (a charge capacity)≤1.

Further, regarding the discharge-charge efficiency in the present embodiment, in the case where the discharge (the discharge 1, the first output electricity quantity)→the charge (the charge 1, the first input electricity quantity)→the discharge (the discharge 2, the second output electricity quantity) are carried out, the discharge-charge efficiency is defined as a ratio between the first input electricity quantity and the second output electricity quantity. Normally, the discharge-charge efficiency is a numerical value of 1 or greater.

The discharge-charge efficiency=the first input electricity quantity (the charge capacity)/the second output electricity quantity (a discharge capacity)≥1.

The input electricity quantity (the charge capacity) and the output electricity quantity (the discharge capacity) are calculated by a product of a current value and a detection time detected by the current sensor 103.

Further, the first output electricity quantity is defined as at least any one of the following current quantities of, during the discharge 1, 1) a total electricity quantity when taking out (discharging) a load for an arbitrary time, and 2) a total electricity quantity taken out from the battery between arbitrary battery capacities or between arbitrary battery voltages. The first output electricity quantity is called also the discharge capacity.

The first input electricity quantity is defined as at least any one of the following current quantities of, during the charge 1 after the discharge 1, 1) a total electricity quantity charged for an arbitrary time, and 2) a total electricity quantity charged in the battery between arbitrary battery capacities or between arbitrary battery voltages. The first input electricity quantity is called also the charge capacity.

The second output electricity quantity is defined as at least any one of the following current quantities of, during the discharge 2 after the charge 1, 1) a total electricity quantity when taking out a load for an arbitrary time, and 2) a total electricity quantity taken out from the battery between arbitrary battery capacities or between arbitrary battery voltages. The second output electricity quantity is called also the discharge capacity.

In a case where the charge-discharge efficiency and the discharge-charge efficiency are determined, besides determining these efficiencies when each process is carried out in an order as described above of the discharge 1 (the first output electricity quantity)→the charge 1 (the first input electricity quantity)→the discharge 2 (the second output electricity quantity), these efficiencies can be determined also when each process is carried out in an order of the charge 1 (the first input electricity quantity)→the discharge 1 (the first output electricity quantity)→a charge 2 (a second charge) (a second input electricity quantity).

The discharge-charge efficiency in this case is defined as a ratio between the first input electricity quantity and the first output electricity quantity. Normally, the discharge-charge efficiency in this case is a numerical value of 1 or greater.

The discharge-charge efficiency=the first input electricity quantity (the charge capacity)/the first output electricity quantity (the discharge capacity)≥1.

Further, the charge-discharge efficiency in this case is defined as a ratio between the first output electricity quantity and the second input electricity quantity. Normally, the charge-discharge efficiency in this case is a numerical value of 1 or less.

The charge-discharge efficiency=the first output electricity quantity (the discharge capacity)/the second input electricity quantity (the charge capacity)≤1.

The input electricity quantity (the charge capacity) and the output electricity quantity (the discharge capacity) in this case are also calculated by a product of a current value and a detection time detected by the current sensor 103.

Further, the first input electricity quantity in this case is defined as at least any one of the following current quantities of, during the charge 1, 1) a total electricity quantity charged for an arbitrary time, and 2) a total electricity quantity charged in the battery between arbitrary battery capacities or between arbitrary battery voltages. The first input electricity quantity in this case is called also the charge capacity.

Furthermore, the first output electricity quantity in this case is defined as at least any one of the following current quantities of, during the discharge 1 after the charge 1, 1) a total electricity quantity when taking out (discharging) a load for an arbitrary time, and 2) a total electricity quantity taken out from the battery between arbitrary battery capacities or between arbitrary battery voltages. The first output electricity quantity in this case is called also the discharge capacity.

Moreover, the second input electricity quantity in this case in defined as at least any one of the following current quantities of, during the charge 2 after the discharge 1, 1) a total electricity quantity charged for an arbitrary time, and 2) a total electricity quantity charged in the battery between arbitrary battery capacities or between arbitrary battery voltages. The second input electricity quantity in this case is called also the charge capacity.

Typical deterioration patterns of the secondary battery, obtained by plotting the charge-discharge efficiency and the discharge-charge efficiency defined as described above with respect to a time axis (actual time or the actual number of cycles) when a plurality of the charges/discharges of the secondary battery 101 are repeated, are shown in FIGS. 3 (3A and 3B) to 5 (5A and 5B).

Figure 3A:
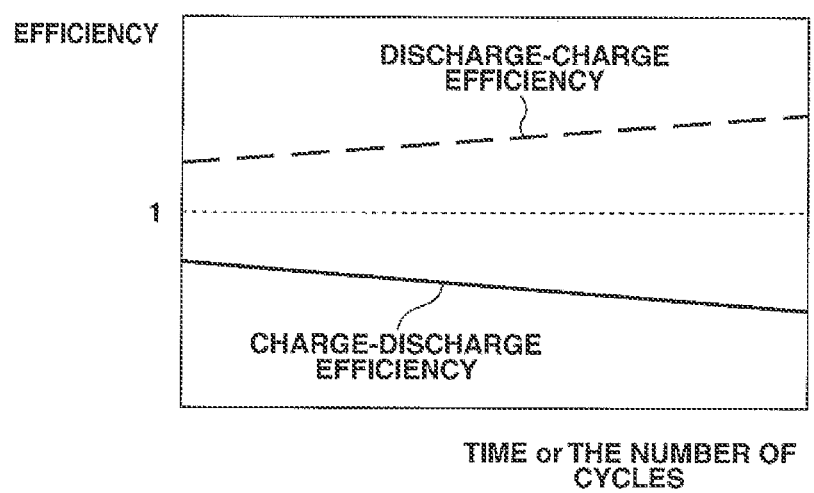
FIG. 3A is a graph showing a first pattern of temporal change characteristics of a charge-discharge efficiency and a discharge-charge efficiency of a secondary battery.
Figure 3B:
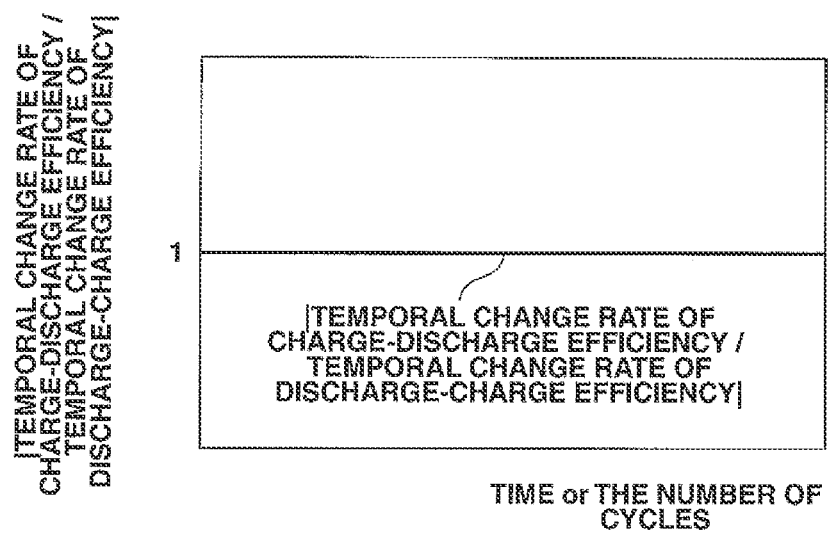
FIG. 3B is a graph of the first pattern of FIG. 3A shown by absolute value of a ratio between a temporal change rate of the charge-discharge efficiency and a temporal change rate of the discharge-charge efficiency.

FIG. 3A is a graph showing a first deterioration pattern of the typical three deteriorate ion patterns. The first deterioration pattern is a pattern in which, as shown in FIG. 3A, a temporal change rate of the charge-discharge efficiency and a temporal change rate of the discharge-charge efficiency are equal to each other (absolute values of slopes of both efficiencies are equal to each other) and both characteristics are symmetric with respect to a line of efficiency=1. In other words, as shown in FIG. 3B, the first deterioration pattern is a deterioration pattern in which an absolute value of a ratio between the temporal change rate of the charge-discharge efficiency and the temporal change rate of the discharge-charge efficiency (=|the temporal change rate of the charge-discharge efficiency/the temporal change rate of the discharge-charge efficiency|) is 1.

In this first deterioration pattern, even though the charge was continued, such decrease in life of the secondary battery 101 as disclosed in the related art technique was not observed.

As a deterioration mechanism of the first deterioration pattern, it can be estimated that the lithium ions released or desorbed from the positive electrode of the secondary battery 101 are inserted into or enter the negative electrode (the charge), and the lithium ions received by the negative electrode are released then are inserted into the positive electrode (the discharge). That is, it is conceivable that there is no deterioration in patterns in both of a positive electrode capacity and a negative electrode capacity.

In addition, it is conceivable that the reason why the charge-discharge efficiency is the numerical value of 1 or less and the discharge-charge efficiency is the numerical value of 1 or greater is because, as a major factor, the lithium ions are changed to an electrochemically inert state such as inorganic lithium compound and organolithium compound before being inserted into/released from the positive electrode or the negative electrode and the number of the lithium ions that move is decreased due to this change.

Figure 4A:
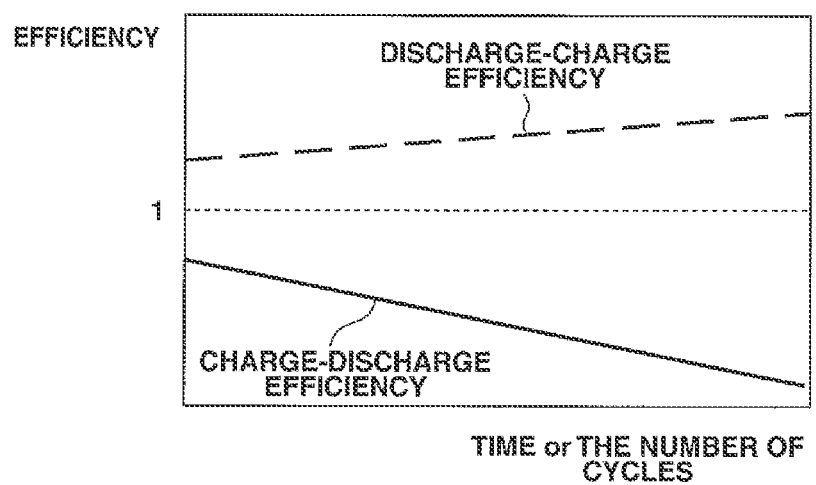
FIG. 4A is a graph showing a second pattern of temporal change characteristics of a charge-discharge efficiency and a discharge-charge efficiency of the secondary battery.
Figure 4B:
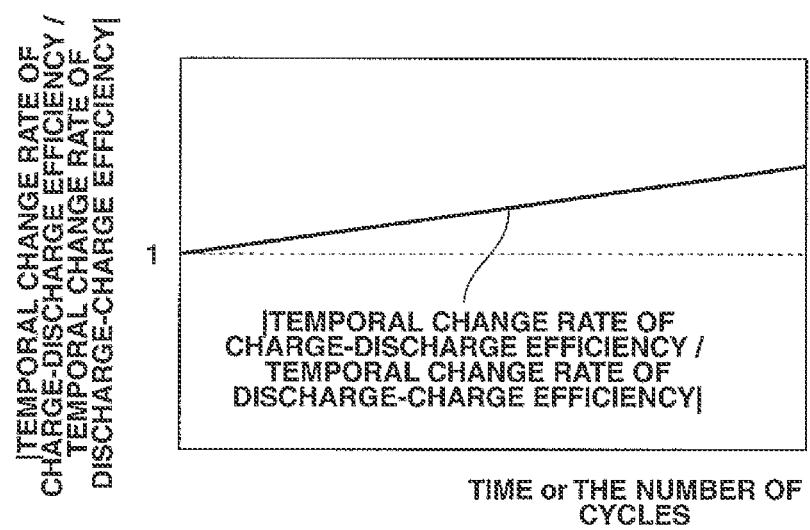
FIG. 4B is a graph of the second pattern of FIG. 4A shown by absolute value of a ratio between a temporal change rate of the charge-discharge efficiency and a temporal change rate of the discharge-charge efficiency.

FIG. 4A is a graph showing a second deterioration pattern of the typical three deterioration patterns. The second deterioration pattern is a pattern in which, as shown in FIG. 4A, when comparing the absolute values of the temporal change rate of the charge-discharge efficiency and the temporal change rate of the discharge-charge efficiency, the absolute value of the temporal change rate of the charge-discharge efficiency is greater (a temporal decrease amount of the charge-discharge efficiency is relatively great with respect to a temporal increase amount of the discharge-charge efficiency) and both characteristics are asymmetric with respect to the line of efficiency=1. In other words, as shown in FIG. 4B, the second deterioration pattern is a deterioration pattern in which the absolute value of the ratio between the temporal change rate of the charge-discharge efficiency and the temporal change rate of the discharge-charge efficiency (=|the temporal change rate of the charge-discharge efficiency/the temporal change rate of the discharge-charge efficiency|) is greater than 1.

In this second deterioration pattern, when the charge was continued, such decrease in life of the secondary battery 101 as disclosed in the related art technique was observed. A concrete case of this second deterioration pattern will be explained later.

As a deterioration mechanism of the second deterioration pattern, it can be estimated that the lithium ions released or desorbed from the positive electrode of the secondary battery 101 are inserted into or enter the negative electrode (the charge), and a part of the lithium ions received by the negative electrode is in a state in which the lithium ions can not be released from the negative electrode, and remaining released lithium ions are inserted into the positive electrode (the discharge). That is, it is conceivable that deterioration of the negative electrode capacity progresses.

With regard to this deterioration of the negative electrode capacity, it is conceivable that reduction of the lithium ion insertion/release performance due to deterioration of the negative electrode active material and/or incapability of releasing the inserted lithium ions due to deterioration of electronic conduction of the negative electrode layer is a major factor.

Figure 5A:
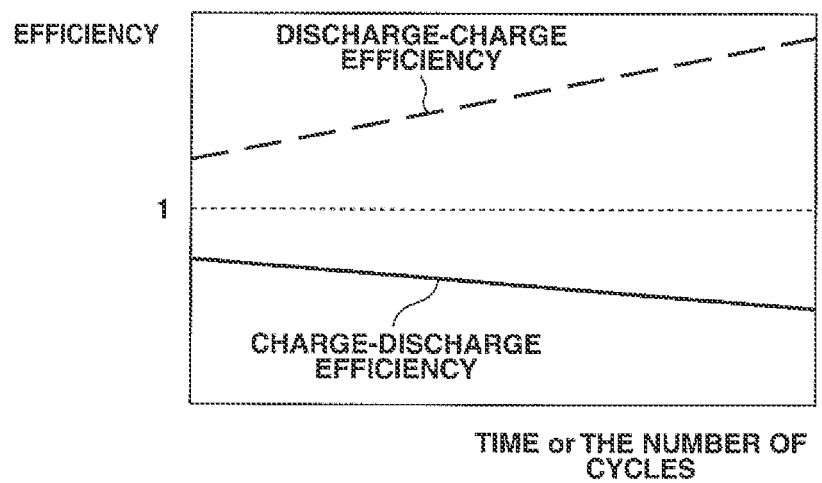
FIG. 5A is a graph showing a third pattern of temporal change characteristics of a charge-discharge efficiency and a discharge-charge efficiency of the secondary battery.
Figure 5B:
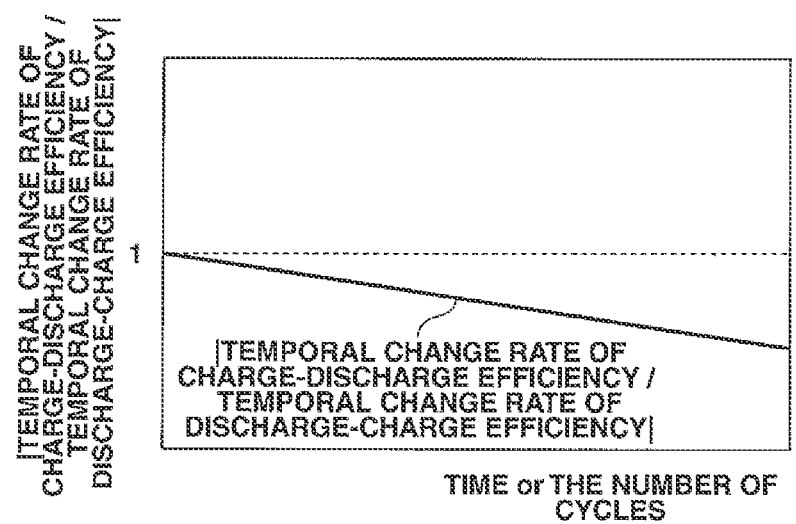
FIG. 5B is a graph of the third pattern of FIG. 5A shown by absolute value of a ratio between a temporal change rate of the charge-discharge efficiency and a temporal change rate of the discharge-charge efficiency.

FIG. 5A is a graph showing a third deterioration pattern of the typical three deterioration patterns. The third deterioration pattern is a pattern in which, as shown in FIG. 5A, when comparing the temporal change rate of the charge-discharge efficiency and the temporal change rate of the discharge-charge efficiency, the absolute value of the temporal change rate of the discharge-charge efficiency is greater (a temporal increase amount of the discharge-charge efficiency is relatively great with respect to a temporal decrease amount, of the charge-discharge efficiency) and both characteristics are asymmetric with respect to the line of efficiency=1. In other words, as shown in FIG. 5B, the third deterioration pattern is a deterioration pattern in which the absolute value of the ratio between the temporal change rate of the charge-discharge efficiency and the temporal change rate of the discharge-charge efficiency (=|the temporal change rate of the charge-discharge efficiency/the temporal change rate of the discharge-charge efficiency|) is smaller than 1.

In this third deterioration pattern, even though the charge was continued, such decrease in life of the secondary battery 101 as disclosed in the related art technique was not observed. A concrete case of this third deterioration pattern will be explained later.

As a deterioration mechanism of the third deterioration pattern, it can be estimated that the lithium ions released or desorbed from the positive electrode of the secondary battery 101 are inserted into or enter the negative electrode (the charge), and a lithium ion reception performance of the positive electrode when the lithium ions received by the negative electrode are released and are inserted into the positive electrode (the discharge) is reduced.

With regard to this deterioration of the positive electrode capacity, it is conceivable that reduction of the lithium ion insertion/release performance due to deterioration of a crystal structure of the positive electrode active material and/or incapability of inserting the lithium ions due to deterioration of electronic conduction of the negative electrode layer is a major factor.

Here, the concrete cases of the second and third deterioration patterns will be explained.

<<Case of Second Deterioration Pattern>>

A vehicle battery pack was made using the battery cell(s) whose initial battery capacity; negative electrode capacity/positive electrode capacity=1.2, and a vehicle travelling test was carried out with the battery pack mounted in an actual vehicle (an electric vehicle) for one year (a travel distance was 30,000 km). The battery capacity of the vehicle battery pack was reduced by 5%.

By reading travel recording data stored in a travel recording device of this vehicle, extracting one-year data about the charge-discharge efficiency and the discharge-charge efficiency whose SOC is 50%~80% and arranging them in a time series, the temporal change rate of the charge-discharge efficiency and the temporal change rate of the discharge-charge efficiency were determined. As a result of determining both efficiencies, the temporal change rate of the charge-discharge efficiency was −0.9%, and the temporal change rate of the discharge-charge efficiency was 0.4%.

From this result, since the absolute value of the ratio between the temporal change rate of the charge-discharge efficiency and the temporal change rate of the discharge-charge efficiency (|the temporal change rate of the charge-discharge efficiency/the temporal change rate of the discharge-charge efficiency|) is |−0.9/0.4=2.25, it can be estimated that this corresponds to the second deterioration pattern described above.

In order to verify whether this case is the second deterioration pattern, the vehicle battery pack was dismantled, and a pair of the positive and negative electrodes were pulled out, then a 2023 type coin cell was made (N=5). 1M $LiPF_6$ was used as the lithium salt for the electrolyte, and composition of EC/DEC=1:1 was used for the solvent.

Upon determining the positive electrode capacity, the coin cell made was set in a charging/discharging device. Further, the coin cell was charged by low current (a rate 0.05 C) until an open circuit voltage reaches 4.2V while measuring the open circuit voltage, and after the open circuit voltage reaches this volt age, a low voltage charge was carried cut for an hour.

After the end of the charge, the coin cell set in the charging/discharging device was left for 10 minutes, and the coin cell was discharged by low current (a rate 0.05 C). Capacity [mAh/g] of the positive electrode=discharge current value [mA]×time [h] required for the end of the discharge/mass [g] of the positive electrode active material, in this case, was determined.

As for the negative electrode capacity, the coin cell made was set in the charging/discharging device. Further, the coin cell was charged by low current (a rate 0.05 C) until the open circuit voltage reaches 0.05V while measuring the open circuit voltage, and after the open circuit voltage reaches this voltage, a low voltage charge was carried out for an hour.

After the end of the charge, the coin cell set in the charging/discharging device was left for 10 minutes, and the coin cell was discharged by low current (a rate 0.05 C). Capacity [mAh/g] of the negative electrode=discharge current value [mA]×time [h] required for the end of the discharge/mass [g] of the negative electrode active material, in this case, was determined.

When the negative electrode capacity/the positive electrode capacity was determined using the positive electrode capacity and the negative electrode capacity having been determined in this manner, it was 1.12 (<the initial value 1.2).

From the above verification, this case was confirmed that the deterioration of the negative electrode is the major factor of the reduction of the battery capacity. Also, it was confirmed that an estimation method according to the present invention using the absolute value of the ratio between the temporal change rate of the charge-discharge efficiency and the temporal change rate of the discharge-charge efficiency (|the temporal change rate of the charge-discharge efficiency/the temporal change rate of the discharge-charge efficiency|) is correct.

<<Case of Third Deterioration Pattern>>

A vehicle battery pack, which is same as the above case, was made using the battery cell(s) whose initial battery capacity; negative electrode capacity/positive electrode capacity=1.2, and a vehicle travelling test was carried out with the battery pack mounted in an actual vehicle (an electric vehicle) for one year (a travel distance was 30,000 km). The battery capacity of the vehicle battery pack was reduced by 5%.

By reading travel recording data stored in a travel recording device of this vehicle, extracting one-year data about the charge-discharge efficiency and the discharge-charge efficiency whose SOC is 20%-90% and arranging them in a time series, the temporal change rate of the charge-discharge efficiency and the temporal change rate of the discharge-charge efficiency were determined. As a result of determining both efficiencies, the temporal change rate of the charge-discharge efficiency was −0.3%, and the temporal change rate of the discharge-charge efficiency was 0.8%.

From this result, since the absolute value of the ratio between the temporal change rate of the charge-discharge efficiency and the temporal change rate of the discharge-charge efficiency (|the temporal change rate of the charge-discharge efficiency/the temporal change rate of the discharge-charge efficiency|) is |−0.3/0.8|=0.375, it can be estimated that this corresponds to the third deterioration pattern described above.

In order to verify whether this case is the third deterioration pattern, the vehicle battery pack was dismantled, and a pair of the positive and negative electrodes were pulled out, then a 2023 type coin cell was made (N=5). 1M $LiPF_6$ was used as the lithium salt for the electrolyte, and composition of EC/DEC=1:1 was used for the solvent.

Upon determining the positive electrode capacity, the coin cell made was set in a charging/discharging device. Further, the coin cell was charged by low current (a rate 0.05 C) until an open circuit voltage reaches 4.2V while measuring the open circuit voltage, and after the open circuit voltage reaches this voltage, a low voltage charge was carried out for an hour.

After the end of the charge, the coin cell set in the charging/discharging device was left for 10 minutes, and the coin cell was discharged by low current (a rate 0.05 C). Capacity [mAh/g] of the positive electrode=discharge current value [mA]×time [h] required for the end of the discharge/mass [g] of the positive electrode active material, in this case, was determined.

As for the negative electrode capacity, the coin cell made was set in the charging/discharging device. Further, the coin cell was charged by low current (a rate 0.05 C) until the open circuit voltage reaches 0.5V while measuring the open circuit voltage, and after the open circuit voltage reaches this voltage, a low voltage charge was carried out for an hour.

After the end of the charge, the coin cell set in the charging/discharging device was left for 0.10 minutes, and the coin cell was discharged by low current (a rate 0.05 C). Capacity [mAh/g] of the negative electrode=discharge current value [mA]×time [h] required for the end of the discharge/mass [g] of the negative electrode active material, in this case, was determined.

When the negative electrode capacity/the positive electrode capacity was determined using the positive electrode capacity and the negative electrode capacity having been determined in this manner, it was 1.23 (<the initial value 1.2).

From the above verification, this case was confirmed that the deterioration of the positive electrode is the major factor of the reduction of the battery capacity. Also, it was confirmed that an estimation method according to the present invention using the absolute value of the ratio between the temporal change rate of the charge-discharge efficiency and the temporal change rate of the discharge-charge efficiency (|the temporal change rate of the charge-discharge efficiency/the temporal change rate of the discharge-charge efficiency|) is correct.

As described above, in the case of the second deterioration pattern (FIGS. 4A and 4B) of the typical three deterioration patterns, deterioration of the life of the secondary battery 101 occurred. In the case of the first deterioration pattern (FIGS. 3A and 3B) and the third deterioration pattern (FIGS. 5A and 5B), the deterioration of the life of the secondary battery 101 was not observed. Thus, in the present embodiment, in the case where the second deterioration pattern is detected, the charge termination voltage is set to a voltage value that is lower than a normal value. Also, in the case where the other pattern of the first or third deterioration pattern is detected, the charge termination voltage is kept at the normal value. In the following description, a setting control of this charge termination voltage will be explained in the following two embodiments.

First Embodiment

FIG. 2 is a flow chart showing a control procedure of the control unit 107 of FIG. 1 according to a first embodiment.

At step S201, the control unit 107 reads the detection signal of the current sensor 103 each time a charge operation and a discharge operation of the secondary battery 101 are performed.

At step S202, the control unit 107 calculates the charge-discharge efficiency and the discharge-charge efficiency in accordance with the above-mentioned definition equation each time the charge operation and the discharge operation of the secondary battery 101 are performed. Then, the control unit 107 calculates the absolute value of the ratio between the temporal change rate of the charge-discharge efficiency obtained and the temporal change rate of the discharge-charge efficiency obtained (=|the temporal change rate of the charge-discharge efficiency/the temporal change rate of the discharge-charge efficiency|).

Figure 10:
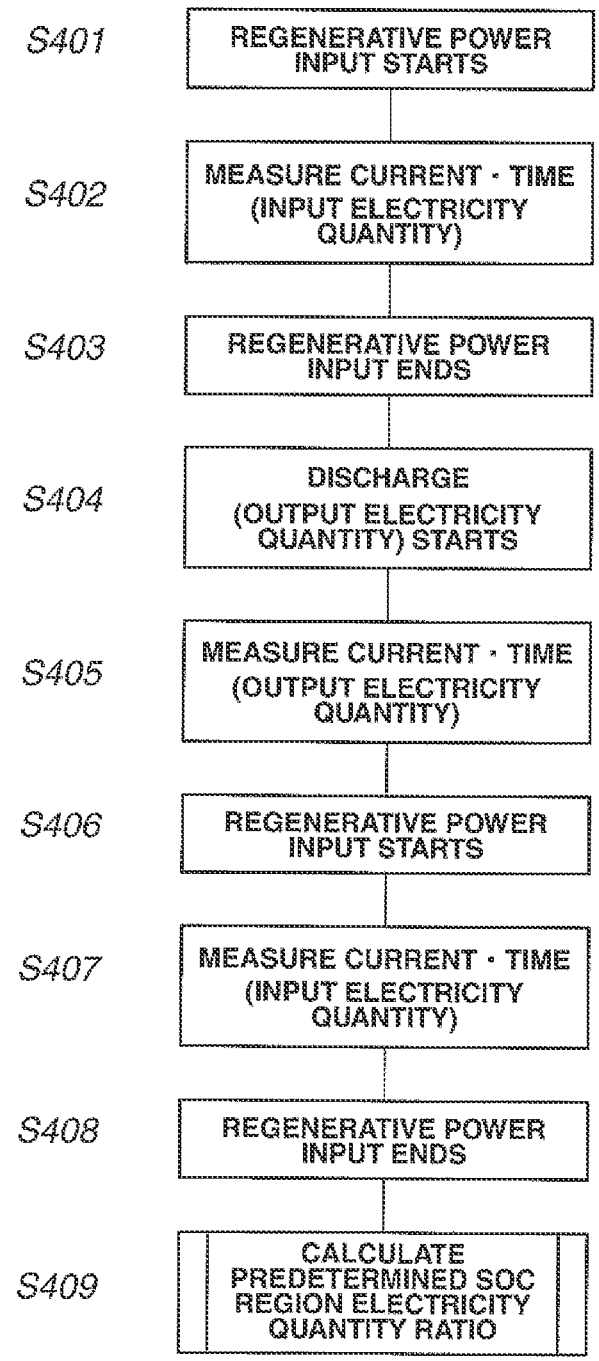
FIG. 10 is a flow chart of a control procedure more specifically showing steps S201 and S202 of FIG. 2.
Figure 11:
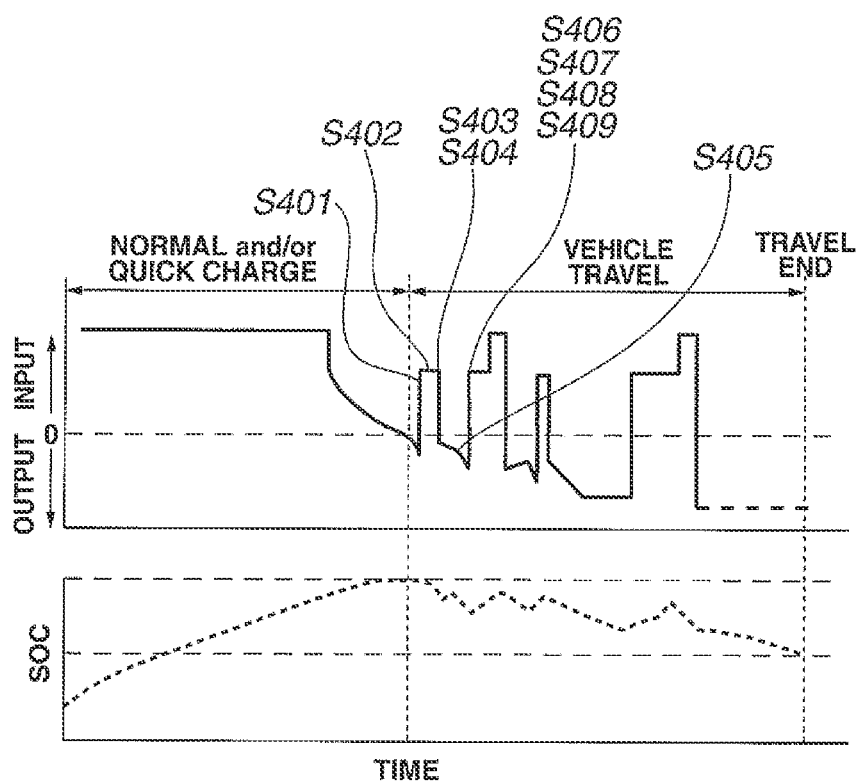
FIG. 11 is a graph showing an example of a relationship between a secondary battery power input/output time-varying pattern and an SOC.

FIG. 10 is a flow chart of a control procedure more specifically showing steps S201 and S202 of FIG. 2. FIG. 11 is a graph showing an example of a relationship between a secondary battery 101 power input/output time-varying pattern and an SOC, which is an example of a pattern corresponding to each step of FIG. 10. The specific example shown in FIGS. 10 and 11 is an example in which the charge control device 105 of FIG. 1 controls the regenerative power generated by the vehicle-mounted motor/generator. The detect ion data such as the voltage, the current and the temperature is calculated and corrected using each database previously stored in the control unit 107, and the control, unit 107 calculates a charge state.

First, at step S401, after recognizing a deceleration signal such as vehicle accelerator OFF and a brake input in the control unit 107, the charge state is calculated from the secondary battery voltage detected by the voltage sensor 102 and the secondary battery temperature detected by the temperature sensor 104, and its data is stored in a memory in the control unit 107.

At step S402, a quantity of electricity is calculated at an arbitrary time interval, in the current sensor 103, for a time period from a start of input of the current from the motor/generator to the secondary battery 101 to an end of the input of the current, and its data is stored in the memory in the control unit 107.

At step S403, after the input of the current from the motor/generator ends, the charge state is calculated from the secondary battery voltage detected by the voltage sensor 102 and the secondary battery temperature detected by the temperature sensor 104, and this data is stored in the memory in the control unit 107. This becomes a first input electricity quantity.

At step S404, after recognizing an acceleration signal such as vehicle accelerator ON in the control unit 107, the charge state is calculated from the secondary battery voltage detected by the voltage sensor 102 and the secondary battery temperature detected by the temperature sensor 104, and its data is stored in the memory in the control unit 107.

At step S405, a quantity of electricity is calculated at an arbitrary time interval, in the current sensor 103, for a time period from a start of output of the current from the secondary battery 101 to an end of the output of the current, and its data is stored in the memory in the control unit 107. This becomes a first output electricity quantity.

At step S406, after recognizing a deceleration signal such as the vehicle accelerator OFF and the brake input in the control unit 107, the charge state is calculated from the secondary battery voltage detected by the voltage sensor 102 and the secondary battery temperature detected by the temperature sensor 104, and its data is stored in the memory in the control unit 107.

At step S407, a quantity of electricity is calculated at an arbitrary time interval, in the current sensor 103, for a time period from a start of input of the current from the motor/generator to the secondary battery 101 to an end of the input of the current, and its data is stored in the memory in the control unit 107. This becomes a second input electricity quantity.

At step S408, after the input of the current from the motor/generator ends, the charge state is calculated from the secondary battery voltage detected by the voltage sensor 102 and the secondary battery temperature detected by the temperature sensor 104, and its data is stored in the memory in the control unit 107.

At step S409, the following calculation is performed from the data stored in the memory in the control unit 107. That is, a ratio between the first input electricity quantity of step S402 and the first output electricity quantity of step S405 is determined as the charge-discharge efficiency. Also, a ratio between the first output electricity quantity of step S405 and the second input electricity quantity of step S407 is determined as the discharge-charge efficiency. Further, the absolute value of the ratio between the temporal change rate of the charge-discharge efficiency and the temporal change rate of the discharge-charge efficiency (=|the temporal change rate of the charge-discharge efficiency/the temporal change rate of the discharge-charge efficiency|) is determined. Then, these calculation results are stored in the memory in the control unit 107.

Figure 12:
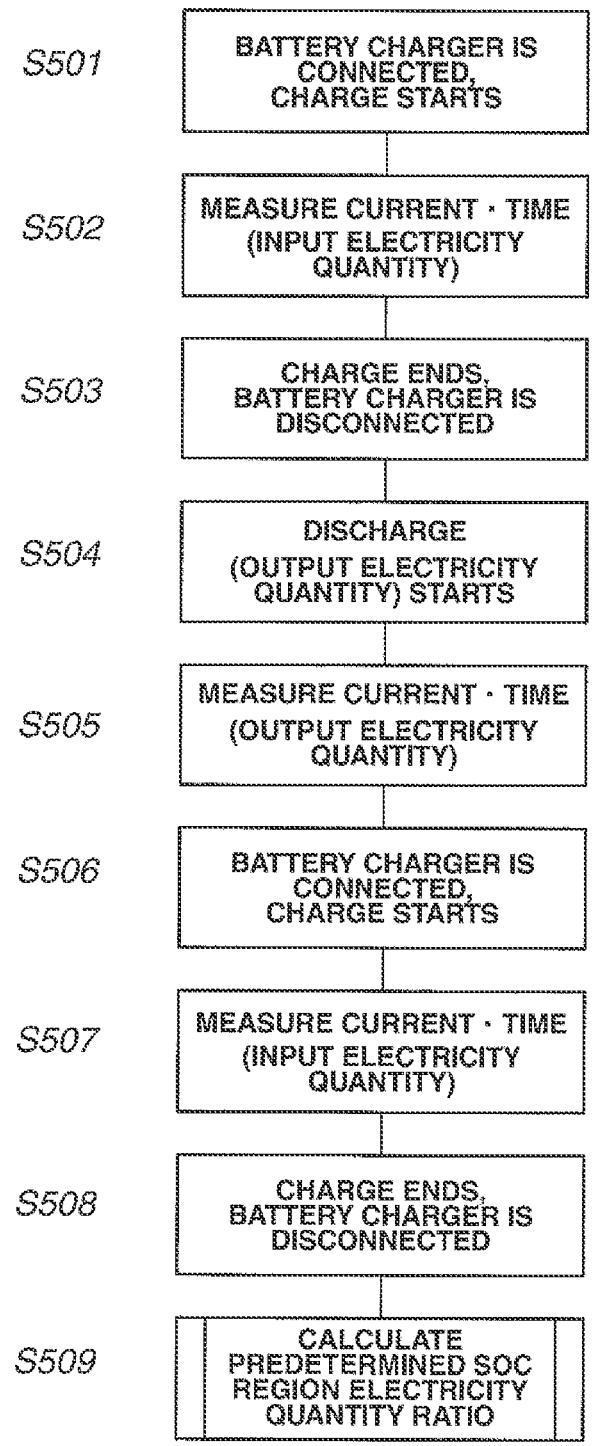
FIG. 12 is a flow chart of another control procedure more specifically showing steps S201 and S202 of FIG. 2.
Figure 13:
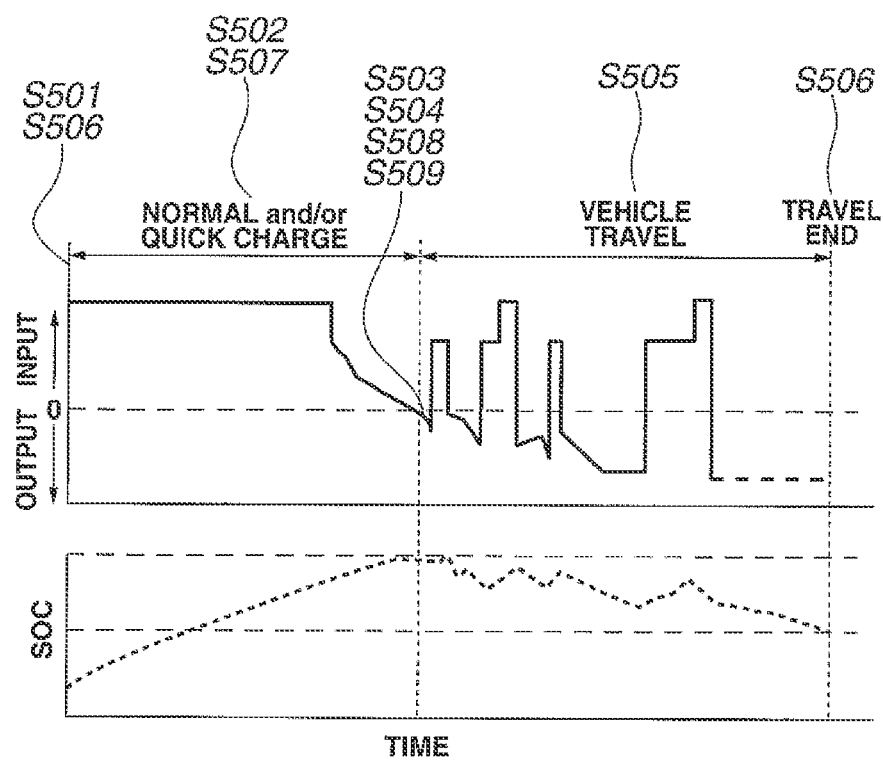
FIG. 13 is a graph showing an example of a relationship between a secondary battery power input/output time-varying pattern and an SOC.

FIG. 12 is a flowchart of another control procedure more specifically showing steps S201 and S202 of FIG. 2. FIG. 13 is a graph showing an example of a relationship between a secondary battery 101 power input/output time-varying pattern and an SOC, which is an example of a pattern corresponding to each step of FIG. 12. The specific example shown in FIGS. 12 and 13 is an example in which the charge control device 105 of FIG. 1 controls the power provided from the external charging system such as the charging stand. The detection data such as the voltage, the current and the temperature is calculated and corrected using each database previously stored in the control unit 107, and the control unit 107 calculates a charge state.

First, at step S501, after recognizing a charge start signal from the external charging system in the control unit 107, the charge state is calculated from the secondary battery voltage detected by the voltage sensor 102 and the secondary battery temperature detected by the temperature sensor 104, and its data is stored in the memory in the control unit 107.

At step S502, a quantity of electricity is calculated at an arbitrary time interval, in the current sensor 103, for a time period from a start of input of the current from the external charging system to the secondary battery 101 to an end of the input of the current, and its data is stored in the memory in the control unit 107. This becomes a first input electricity quantity.

At step S503, after the input of the current from the external charging system ends, the charge state is calculated from the secondary battery voltage detected by the voltage sensor 102 and the secondary battery temperature detected by the temperature sensor 104, and its data is stored in the memory in the control unit 107. The vehicle stops or is in a starting standby state (or a start waiting state).

At step S504, after recognizing a vehicle output signal such as a vehicle starting signal in the control unit 107, the charge state is calculated from the secondary battery voltage detected by the voltage sensor 102 and the secondary battery temperature detected by the temperature sensor 104, and its data is stored in the memory in the control unit 107.

At step S505, a quantity of electricity is calculated at an arbitrary time interval, in the current sensor 103, for a time period from a start of output of the current from the secondary battery 101 to an end of the output of the current, and its data is stored in the memory in the control unit 107. This becomes a first output electricity quantity. The vehicle stops or is in the starting standby state (or the start waiting state).

At step S506, after recognizing a charge start signal from the external charging system in the control unit 107, the charge state is calculated from the secondary battery voltage detected by the voltage sensor 102 and the secondary battery temperature detected by the temperature sensor 104, and its data is stored in the memory in the control unit 107.

At step S507, a quantity of electricity is calculated at an arbitrary time interval, in the current sensor 103, for a time period from a start of input of the current from the external charging system to the secondary battery 101 to an end of the input of the current, and its data is stored in the memory in the control unit 107. This becomes a second input electricity quantity.

At step S508, after the input of the current from the external charging system ends, the charge state is calculated from the secondary battery voltage detected by the voltage sensor 102 and the secondary battery temperature detected by the temperature sensor 104, and its data is stored in the memory in the control unit 107. The vehicle stops or is in the starting standby state (or the start waiting state).

At step S509, the following calculation is performed from the data stored in the memory in the control unit 107. That is, a ratio between the first input electricity quantity of step S502 and the first output electricity quantity of step S505 is determined as the charge-discharge efficiency. Also, a ratio between the first output electricity quantity of step S505 and the second input electricity quantity of step S507 is determined as the discharge-charge efficiency. Further, the absolute value of the ratio between the temporal change rate of the charge-discharge efficiency and the temporal change rate of the discharge-charge efficiency (=|the temporal change rate of the charge-discharge efficiency/the temporal change rate of the discharge-charge efficiency|) is determined. Then, these calculation results are stored in the memory in the control unit 107.

At step S203, on the basis of the absolute value of the ratio between the temporal change rate of the charge-discharge efficiency and the temporal change rate of the discharge-charge efficiency (=|the temporal change rate of the charge-discharge efficiency/the temporal change rate of the discharge-charge efficiency|) at a lapse of certain time which is calculated at step S202, it is judged which deterioration pattern of the above first to third patterns the secondary battery 101 corresponds to. That is, it is judged that in a case where the absolute value of the ratio between the rates of the both efficiencies at the lapse of certain time is 1, the secondary battery 101 corresponds to the first deterioration pattern shown in FIG. 3B. Also, it is judged that in a case where the absolute value of the ratio between the rates of the both efficiencies at the lapse of certain time is greater than 1, the secondary battery 101 corresponds to the second deterioration pattern shown in FIG. 4B. Further, it is judged that in a case where the absolute value of the ratio between the rates of the both efficiencies at the lapse of certain time is smaller than 1, the secondary battery 101 corresponds to the third deterioration pattern shown in FIG. 5B.

Then, only in the case where it is judged that the secondary battery 101 corresponds to the second deterioration pattern at step S203, in order to change the charge termination voltage, the routine proceeds to step S204. In the case where it is judged that the secondary battery 101 corresponds to the other pattern of the first or third deterioration pattern at step S203, in order to keep the last value (a previous value) without changing the charge termination voltage, the routine returns to step S201.

At steps S204-S205, since the secondary battery 101 is judged to be in a state of the second deterioration pattern, by controlling the charge control device 105, the charge termination voltage is set to a value that is lower than a value (the last value) that has been set.

In this charge termination voltage changing operation, a predetermined fixed value could be set as a change value. Or alternatively, the charge termination voltage could be set to a value according to a variation of the absolute value of the ratio between the temporal change rate of the charge-discharge efficiency and the temporal change rate of the discharge-charge efficiency. That is, the greater the variation of the absolute value of the ratio between the temporal change rate of the charge-discharge efficiency and the temporal change rate of the discharge-charge efficiency indicated as a vertical axis shown in FIG. 4B, the greater the decrease amount (the decrease range) of the charge termination voltage could be set.

As explained above, according to the control device of the secondary battery of the present embodiment, the deterioration pattern of the secondary battery 101 can be recognized from the temporal change rate of the charge-discharge efficiency and the temporal change rate of the discharge-charge efficiency when repeating the charge operation and the discharge operation of the secondary battery. Then, in the case where the deterioration state of the secondary battery 101 is the second deterioration pattern having the deterioration of the negative electrode as the major factor, by decreasing the charge termination voltage, overcharge can be suppressed. Especially in the case where the deterioration state of the secondary battery 101 is the first or third deterioration pattern which does not require decreasing the charge termination voltage, since the charge termination voltage is kept as it is, excessive or unnecessary suppression of the charge can be avoided.

Further, when decreasing the charge termination voltage, the greater the variation of the absolute value of the ratio between the temporal change rate of the charge-discharge efficiency and the temporal change rate of the discharge-charge efficiency, the greater the decrease amount of the charge termination voltage is set. It is therefore possible to surely suppress the overcharge.

Second Embodiment

A charge speed at which the negative electrode can receive the lithium ions in the secondary battery 101 is affected by the temperature of the secondary battery. That is, an electronic conductivity of the electrolyte and a speed of insertion/release of the lithium ion in the active material follow Arrhenius law, then, the lower the temperature, the slower the charge speed.

Figure 6:
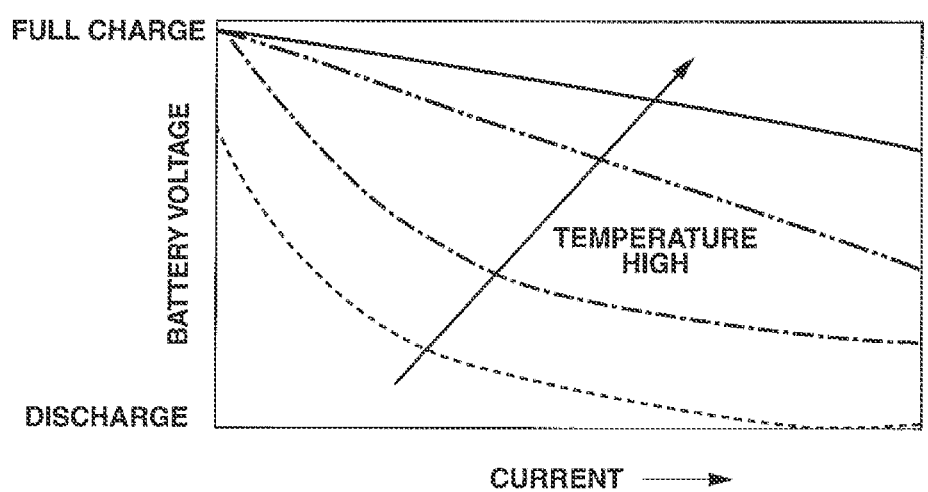
FIG. 6 is a graph of current-voltage characteristics according to temperature of the secondary battery.

FIG. 6 is a graph showing a relationship between the charge current and the voltage or the battery capacity according to the temperature of the secondary battery 101. In a case where the same charge current flows, when the temperature of the secondary battery is high, the battery voltage is also high. When the temperature of the secondary battery is low, the battery voltage is also low.

In the present embodiment, date shown in FIG. 6 is stored in the control unit 107. Then, at an early stage of usage cycle of the secondary battery 101, the charge current and the voltage or the battery capacity are controlled in accordance with a relationship of this predetermined data.

Further, in the present embodiment, in order to realize excessive or unnecessary suppression of the charge control even when the secondary battery 101 is in any temperature environment, this stored data is rewritten. That is, in the case where the secondary battery 101 corresponds to the second deterioration pattern, a process to rewrite the data by an amount of the decrease of the charge termination voltage is executed.

Figure 7:
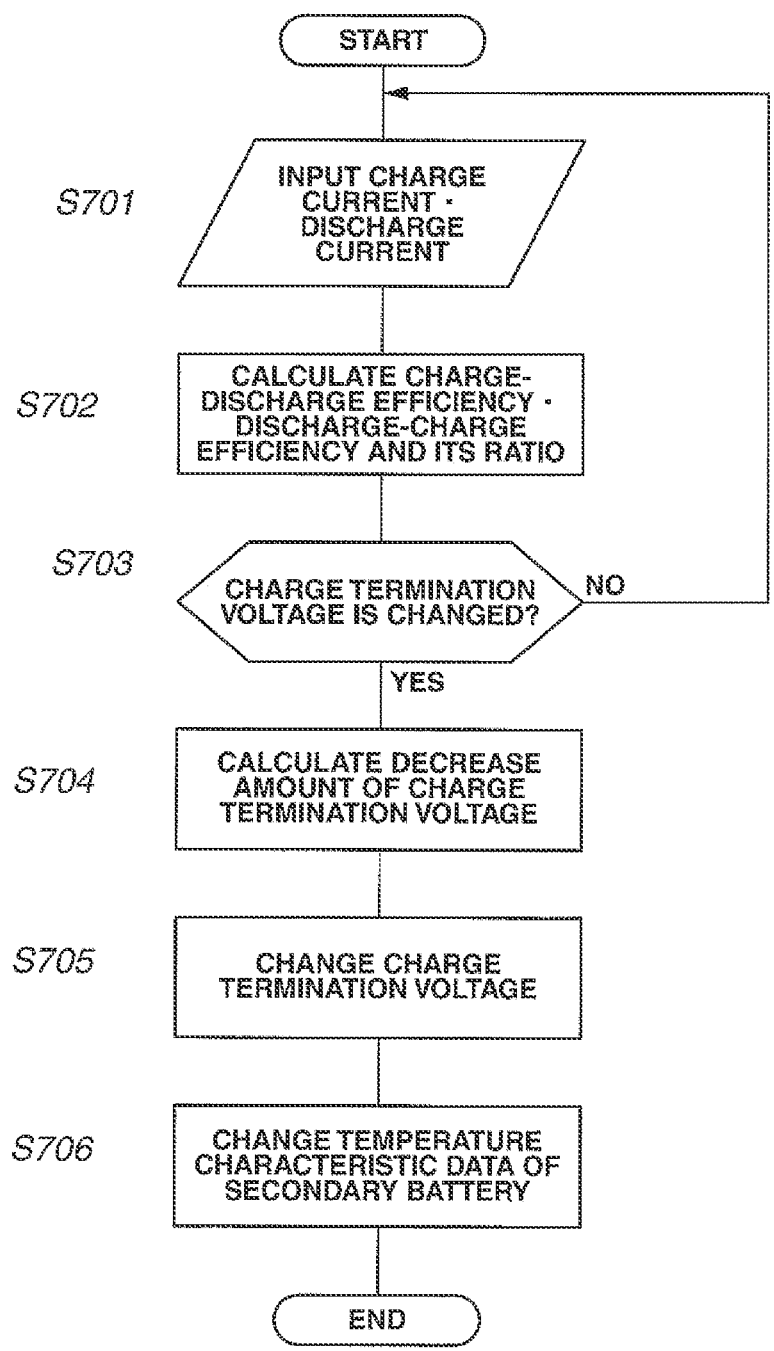
FIG. 7 is a flow chart showing another control procedure of the control unit of FIG. 1.

FIG. 7 is a flow chart showing a control procedure of the control unit 107 according to the present embodiment. Steps S701 to S705 are the same steps as S201 to S205 shown in FIG. 2, thus their explanations will be omitted in the present embodiment. Here, at step S704, it is possible to set the charge termination voltage so that, using the data of FIG. 6, the lower the temperature of the secondary battery 101, the greater the decrease amount of the charge termination voltage.

At step S706, the data, shown in FIG. 6, of the relationship between the charge current and the voltage or the battery capacity according to the temperature of the secondary battery 101 is updated on the basis of the decrease amount of the charge termination voltage which is calculated at step S704 and is set at step S705 and the temperature of the secondary battery 101 which is detected by the temperature sensor 104. That is, the charge voltage decreases due to the deterioration of the secondary battery 101, and the charge voltage at its temperature is updated by an amount equivalent to the decrease of the charge voltage.

With this update or setting, even if environmental temperature of the secondary battery 101 changes, an optimal charge termination voltage setting without excessively limiting the charge of the battery can be realized.

The current sensor 103 corresponds to a current detection means or unit of the present invention. The control unit 107 corresponds to a calculation means or unit, a deterioration judgment means or unit and a control means or unit of the present invention. The temperature sensor 104 corresponds to a temperature detection means or unit of the present invention.

The invention claimed is:

1. A control device of a secondary battery comprising:
a current detection unit that detects a charge current to the secondary battery and a discharge current from the secondary battery;
a calculation unit that calculates, from the charge current and the discharge current, a charge-discharge efficiency and a discharge-charge efficiency when performing a charge operation and a discharge operation;
a deterioration judgment unit that judges a deterioration state of the secondary battery from a temporal change rate of the charge-discharge efficiency and a temporal change rate of the discharge-charge efficiency; and
a control unit that sets a charge termination voltage of the secondary battery in accordance with the deterioration state, wherein: the calculation unit calculates the charge-discharge efficiency from a ratio between a first output electricity quantity calculated by a product of a discharge current and a discharge time in a first discharge and a first input electricity quantity calculated by a product of a charge current and a charge time in a first charge after the first discharge.

2. The control device of the secondary battery as claimed in claim 1, wherein:
the calculation unit calculates the discharge-charge efficiency from a ratio between the first input electricity quantity and a second output electricity quantity calculated by a product of a discharge current and a discharge time in a second discharge after the first charge.

3. A control device of a secondary battery comprising:
a current detection unit that detects a charge current to the secondary battery and a discharge current from the secondary battery;
a calculation unit that calculates, from the charge current and the discharge current, a charge-discharge efficiency and a discharge-charge efficiency when performing a charge operation and a discharge operation;
a deterioration judgment unit that judges a deterioration state of the secondary battery from a temporal change rate of the charge-discharge efficiency and a temporal change rate of the discharge-charge efficiency; and
a control unit that sets a charge termination voltage of the secondary battery in accordance with the deterioration state,
wherein:
the calculation unit calculates the discharge-charge efficiency from a ratio between a first input electricity quantity calculated by a product of a charge current and a charge time in a first charge and a first output electricity quantity calculated by a product of a discharge current and a discharge time in a first discharge after the first charge.

4. The control device of the secondary battery as claimed in claim 1, wherein:
in a case where an absolute value of a ratio between the temporal change rate of the charge-discharge efficiency and the temporal change rate of the discharge-charge efficiency is a predetermined value or greater, the control unit decreases the charge termination voltage.

5. The control device of the secondary battery as claimed in claim 4, wherein:
the control unit sets a decrease amount of the charge termination voltage in accordance with a variation of the absolute value of the ratio between the temporal change rate of the charge-discharge efficiency and the temporal change rate of the discharge-charge efficiency.

6. The control device of the secondary battery as claimed in claim 5, further comprising:
a temperature detection unit that detects temperature of the secondary battery, and wherein
the control unit sets the decrease amount of the charge termination voltage so that the lower the temperature of the secondary battery, the greater the decrease amount of the charge termination voltage.

7. The control device of the secondary battery as claimed in claim 3, wherein:
the calculation unit calculates the charge-discharge efficiency from a ratio between the first output electricity quantity and a second input electricity quantity calculated by a product of a charge current and a charge time in a second charge after the first discharge.

8. The control device of the secondary battery as claimed in claim 3, wherein:
in a case where an absolute value of a ratio between the temporal change rate of the charge-discharge efficiency and the temporal change rate of the discharge-charge efficiency is a predetermined value or greater, the control unit decreases the charge termination voltage.

* * * * *